(12) United States Patent
Ward

(10) Patent No.: US 7,975,194 B2
(45) Date of Patent: Jul. 5, 2011

(54) SYSTEM AND METHOD FOR ADAPTIVE NONLINEAR TEST VECTOR COMPRESSION

(75) Inventor: Samuel I. Ward, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 1107 days.

(21) Appl. No.: 11/738,746

(22) Filed: Apr. 23, 2007

(65) Prior Publication Data

US 2008/0263418 A1 Oct. 23, 2008

(51) Int. Cl.
*G01R 31/28* (2006.01)

(52) U.S. Cl. .................................. 714/726; 714/738

(58) Field of Classification Search .................. 714/724, 714/726, 738, 759, 733, 734, 30, 732
See application file for complete search history.

(56) References Cited

U.S. PATENT DOCUMENTS

| 6,263,422 | B1 * | 7/2001 | Wise et al. | 712/209 |
|---|---|---|---|---|
| 6,330,666 | B1 * | 12/2001 | Wise et al. | 712/300 |
| 6,435,737 | B1 * | 8/2002 | Wise et al. | 712/200 |
| 7,711,938 | B2 * | 5/2010 | Wise et al. | 712/300 |
| 2008/0263423 | A1 * | 10/2008 | Ward | 714/738 |

OTHER PUBLICATIONS

Ward, S. I., C. Schattauer, and N. Touba, "Using Statistical Transformations to Improve Compression for Linear Decompressors," Proc. Of the 2005 20th IEEE International Symposium on Defect and Fault Tolerance in VLSI Systems, pp. 42-50, 2005.

Krishna, C.V., and N.A. Touba, "Reducing Test Data Volume Using LFSR Reseeding with Seed Compression", Proc. Of IEEE International Test Conference, pp. 321-330, 2001 [Krishna 02].

Sun, X., L. Kinney, and B. Vinnakota, "Combining Dictionary Coding and LFSR Reseeding for Test Data Compression," Proc. Of Design Automation Conference, pp. 944-947, 2004 [Sun 04].

* cited by examiner

*Primary Examiner* — Phung M Chung
(74) *Attorney, Agent, or Firm* — Patrick E. Caldwell, Esq.; The Caldwell Firm, LLC

(57) ABSTRACT

A system comprises a decompressor that receives an input test vector and generates an output vector in response to the input test vector. A decoder couples to the decompressor and comprises a reset pattern detector (RPD), a lookup table, and control logic. RPD scans the output vector to identify a predetermined reset pattern. The control logic couples to the RPD and the lookup table and directs operation of the lookup table in a first or second mode based on whether the output vector comprises the predetermined reset pattern, as identified by the RPD. The lookup table receives the output vector, to operate in the first mode, storing one of a plurality of codeword sets, each codeword set comprising a plurality of pairs of codewords and associated data; and to operate in the second mode, generating test data blocks in response to identified codewords in the output vector.

20 Claims, 8 Drawing Sheets

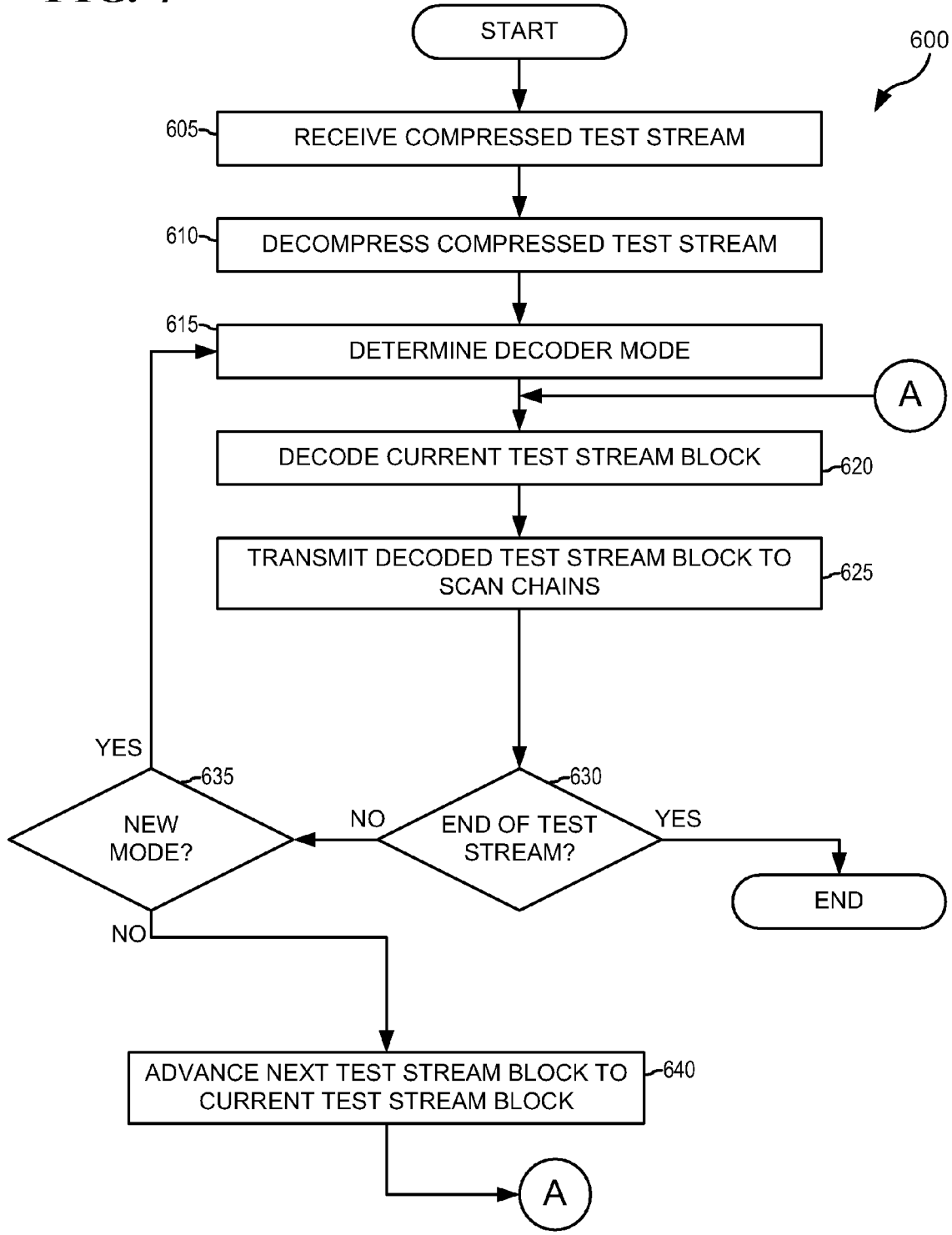

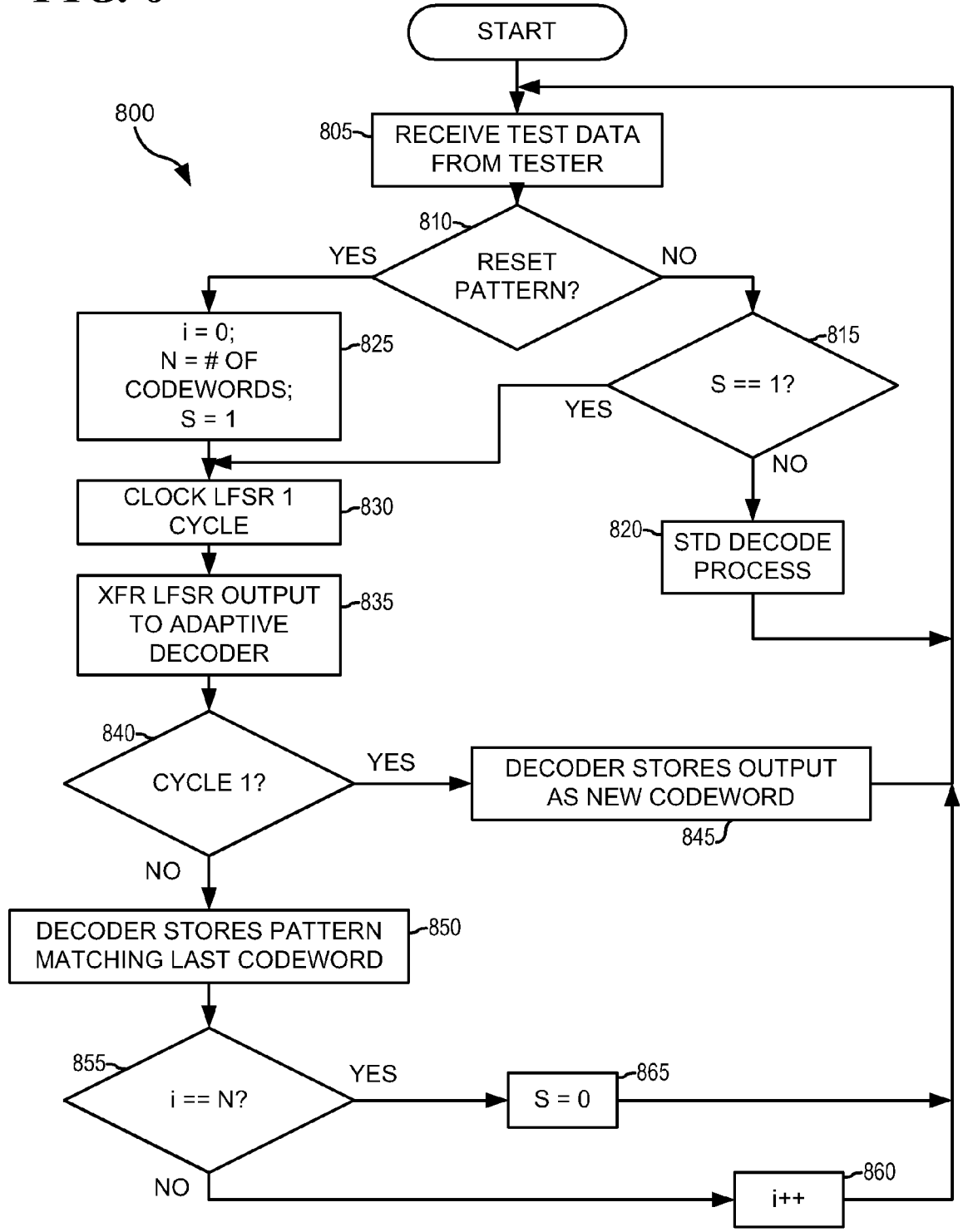

SYSTEM AND METHOD FOR ADAPTIVE NONLINEAR TEST VECTOR COMPRESSION

TECHNICAL FIELD

The present invention relates generally to the field of scan design and test data compression and, more particularly, to a system and method for adaptive nonlinear test vector compression.

BACKGROUND OF THE INVENTION

Modern electronic devices, such as microprocessors, often include a complex matrix of logic gates arranged to perform particular tasks and functions. These logic gates are often interconnected in two parallel arrangements, one arrangement for operation, and another arrangement for testing the functionality of the circuit. Linking a plurality of latches together into a "scan chain" is one popular method of arranging logic units for functional/operational testing. One skilled in the art will appreciate that there are a wide variety of ways to arrange circuit components to facilitate testing. As used herein, "scan chain" refers generally to an arrangement of logic units coupled together for testing.

There are also a number of popular methods to generate test data to apply to the scan chains, as will be understood to one skilled in the art. Generally, test data is data designed to test a particular function or functional unit of an electronic circuit. In scan testing, n scan chains, for example, are loaded with one n-bit block of data at a time each clock cycle (i.e., one "bit-slice" of the scan chain is loaded at a time). Given the test set, the set of n-bit blocks (i.e., bit-slices of the scan chain) can be obtained.

Test data compression provides a means to reduce test costs by reducing tester storage, test time, and test data bandwidth requirements. Compressing the output response is relatively easy because lossy compression techniques can be employed, e.g., using multiple input signature registers (MISR). However, compressing test vectors is much more difficult because lossless compression techniques must be used.

Modern systems have employed a number of coding techniques for test cubes. These include run-length codes, selective Huffman codes, Golomb codes, frequency directed codes, VIHC codes, LZ77, Mutation codes, packet-based codes, and non-linear combination codes. A special class of test vector compression schemes involves using a linear decompressor which uses only linear operations to decompress the test vectors. This class of schemes includes techniques based on linear feedback shift register (LFSR) reseeding and combinational linear expansion circuits consisting of exclusive-OR (XOR) gates. Linear compression schemes are very efficient at exploiting "don't care" values in the test cubes to achieve large amounts of compression. Typical current commercial tools for compressing test vectors rely on linear compression schemes.

The amount of compression that can be achieved with linear compression schemes depends directly on the number of specified bits in the test cubes. While linear decompressors are very efficient at exploiting don't cares in the test set, they cannot exploit correlations in the test data, and hence they cannot compress the test data to less than the total number of specified bits in the test data.

Because of problems with linear compression, some systems use certain non-linear coding techniques. For example, in [Krishna 02] ("Krishna"), supplies inputs to a linear decompressor that are encoded using a non-linear code. Specifically, the objective in Krishna was to select the seeds for the LFSR in such a way that they could be effectively compressed by a non-linear code. The Krishna approach, however, only applies in LFSR reseeding, and is only effective whenever the seed is (periodically) loaded. [Sun 04] ("Sun") takes another approach, wherein dictionary coding and LFSR reseeding are combined such that either one or the other is used to load each scan bit-slice. The Sun approach, however, does not support statistical encoding combined with a continuous-flow linear decompression with greater efficiency.

Therefore, there is a need for a test data compression/decompression system and/or method that that addresses at least some of the problems and disadvantages associated with conventional systems and methods.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide for an improved test data compression/decompression method.

It is a further aspect of the present invention to provide for an improved test data compression/decompression system.

It is a further aspect of the present invention to provide for an improved electronic circuit test system.

The aforementioned aspects and other objectives and advantages can now be achieved as described herein. A system comprises a decompressor configured to receive an input test vector and to generate an output vector in response to the input test vector. A decoder couples to the decompressor and comprises a reset pattern detector, a lookup table, and control logic. The reset pattern detector (RPD) is configured to scan the output vector to identify a predetermined reset pattern. The control logic couples to the RPD and the lookup table and is configured to direct operation of the lookup table in a first mode or a second mode based on whether the output vector comprises the predetermined reset pattern, as identified by the RPD. The lookup table is configured to receive the output vector, to operate in the first mode, comprising storing one of a plurality of codeword sets, each codeword set comprising a plurality of pairs of codewords and associated data; and to operate in the second mode, comprising generating test data blocks in response to identified codewords in the output vector.

In an alternate embodiment, a method for adaptive test data compression includes receiving an input vector. The input vector is decompressed to generate an output vector. A determination is made whether the output vector comprises a reset pattern. In the event the output vector comprises a reset pattern, one of a plurality of codeword sets is loaded into a lookup table; each codeword set comprising a plurality of pairs of codewords and associated data. In the event the output vector does not comprise a reset pattern, codewords in the output vector are identified and test data blocks are generated in response to identified codewords.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

FIG. 4 illustrates a high-level flow diagram depicting logical operational steps of a test data decompression method, which can be implemented in accordance with a preferred embodiment; FIG. 6 illustrates a high-level flow diagram depicting logical operational steps of a test data decompression method, which can be implemented in accordance with a preferred embodiment.

DETAILED DESCRIPTION

Figure 1:
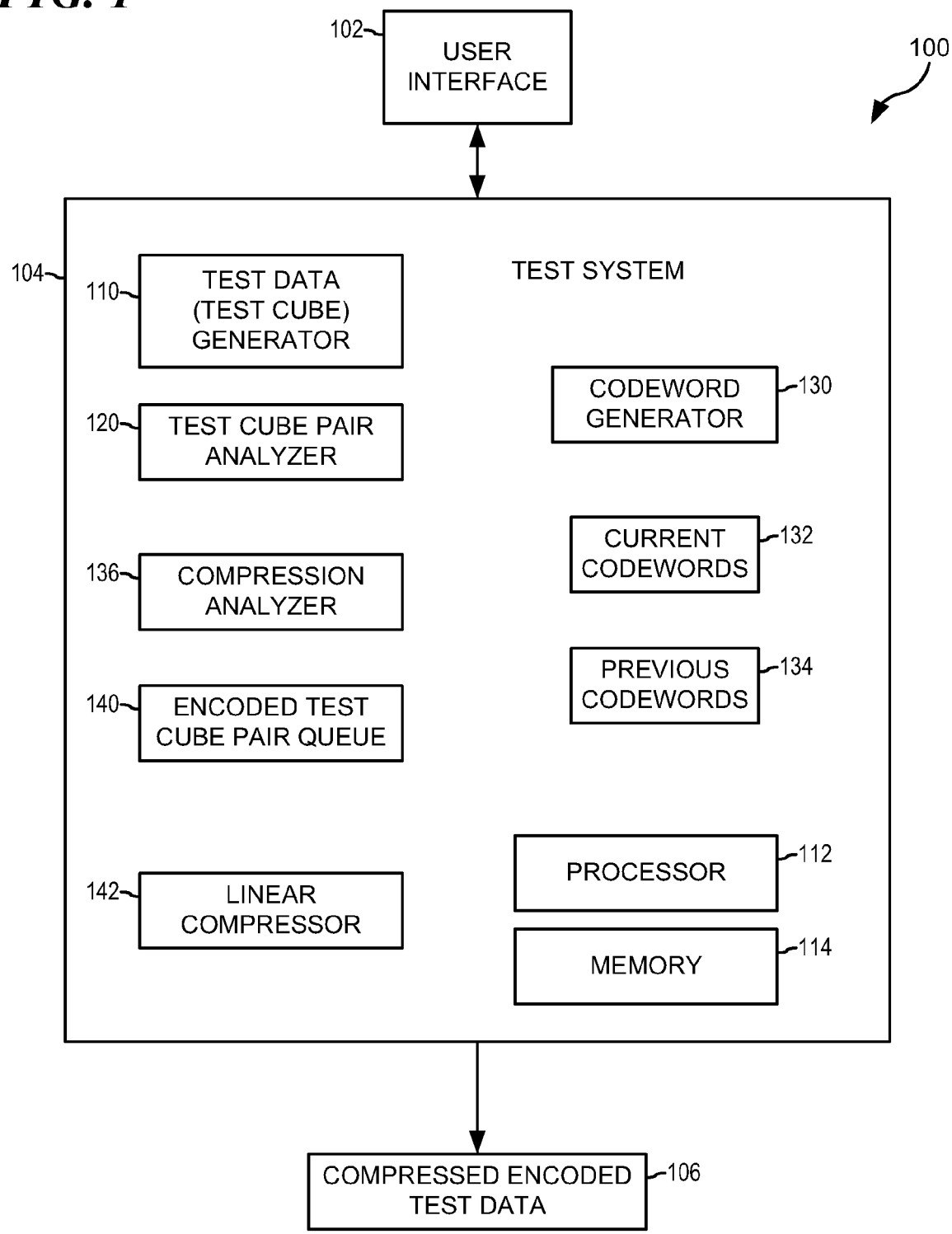
FIG. 1 illustrates a block diagram showing an exemplary test data compression system in accordance with a preferred embodiment.

The particular values and configurations discussed in these non-limiting examples can be varied and are cited merely to illustrate at least one embodiment and are not intended to limit the scope of the invention.

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, user interface or input/output techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or in some combinations thereof. In a preferred embodiment, however, the functions are performed by a processor such as a computer or an electronic data processor in accordance with code such as computer program code, software, and/or integrated circuits that are coded to perform such functions, unless indicated otherwise.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device). Examples of a computer-readable medium include a semiconductor or solid-state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

Referring now to the drawings, FIG. 1 is a high-level block diagram illustrating certain components of a system 100 for test data compression, in accordance with a preferred embodiment of the present invention. System 100 comprises a user interface 102 and a test system 104, which is employed to produce compressed encoded test data 106.

User interface 102 is an otherwise conventional user interface. For example, user interface 102 can comprise a computer monitor, keyboard, and/or computer mouse device. One skilled in the art will recognize a number of suitable user interfaces. In one embodiment, the "medium" that user interface 102 couples to is an external tester.

Generally, in operation, a user, through user interface 102, directs test system 104 to produce compressed encoded test data 106. In an alternate embodiment, test system 104 produces compressed encoded test data 106 as a result of predetermined design features, which can include user input for ad hoc test data customization. In a preferred embodiment, however, test system 104 produces compressed encoded test data 106 automatically, on demand. The test system 104 embodiment described herein is compatible and consistent with direct user input, automatic operation, and a number of embodiments some user input with some automatic operation. One skilled in the art will recognize a number of suitable configurations.

One skilled in the art will also understand that test data are typically a function of a definite underlying circuit structure. That is, test systems generate and use test data to test specific circuits, with known gate configurations, interconnections, etc. The embodiment shown herein manipulates generated test data, and as such, the particular circuit structure is unstated. Test system 104 includes test data (test cube) generator 110, which generates test data in accordance with whichever test data generation method the user desires.

Test data (test cube) generator 110 also generates "test cubes" based on generated test data. As used herein, a "test cube" is a deterministic test vector wherein the unassigned test bits are left as "don't care" (X) bits, instead of assigning random values to the X bits.

Test system 104 also includes a processor 112 and memory 114. Processor 112 is an otherwise conventional processing unit (PU), which can be the sole processor of computations in a device. In such a situation, the PU is typically referred to as an MPU (main processing unit). In other embodiments, processor 112 can be a central processing unit (CPU), which optional attached processing units (APUs) coupled thereto. Processor 112 can also be one of a plurality of PUs that share a computational load according to some methodology or algorithm developed for a given computational device. Memory 114 is an otherwise conventional memory device, and can comprise any number of well-known devices including local memory employed during actual execution of program code, bulk storage, and cache memories to provide storage of at least some of the data processed in and by test system 104.

Test system 104 generally operates as follows. As described above, in scan testing, the n scan chains are loaded with one n-bit "block" of data at a time each clock cycle (i.e., one bit-slice of the scan chain is loaded at a time). Given the test set, the set of n-bit blocks (i.e., bit-slices of the scan chain) can be obtained. Test system 104 encodes these blocks in a manner that reduces the total number of specified bits. Reducing the total number of specified bits across all the blocks provides tangible benefits. For example, the linear decompressor that receives the compressed, encoded test data requires less data from the tester, thereby improving the overall compression, and thus reducing the number of bits that need to be stored on the tester.

Thus, generally, test system 104 performs statistical transformations on generated test cubes using non-linear hardware/software to reduce the number of specified bits that need to be encoded by the linear compressor. In one embodiment, the basic strategy for encoding the test data blocks uses statistical coding. As one skilled in the art will understand, in conventional statistical coding, blocks that occur more frequently are encoded using codewords with relatively fewer bits and blocks that occur less frequently are encoded using codewords with relatively more bits, in order to minimize the average length of a codeword. However, the present invention herein first minimizes the number of specified bits, as opposed to minimizing the average length of a codeword. As described in more detail below, specified-bit minimization is significantly more complicated than conventional statistical encoding.

Additionally, test system 104 also uses selective coding. Generally, for each test data block, test system 104 adds an extra bit to indicate whether a block is coded or unencoded. As described in more detail below, test system 104 encodes a subset of the test data blocks, while the rest are passed through (and compressed) unencoded. As such, the coding scheme is therefore configured to encode the test data blocks only where encoding is more effective. In conventional statistical coding approaches, the most significant impact results from encoding the most frequently occurring test data blocks because it would maximally reduce the total number of bits in the encoded test data stream. However, encoding the most frequently occurring test data blocks does not always yield a test data stream configuration with minimal specified bits. For example, if the most frequently occurring blocks have few specified bits, there may be a greater reduction in overall specified bits if a different test data block is encoded, where the other test data block is slightly less frequently occurring, but has more specified bits.

For example, the first column of Table 1 lists an exemplary set of test data blocks in an exemplary test set:

TABLE 1

Optimal Statistical Code With 3 Groups
Encoded to Minimize Total Bits

| Blocks | Group Pattern | Codeword | Total Bits Before Coding | Total Bits After Coding | Specified Bits Before Coding | Specified Bits After Coding |
| --- | --- | --- | --- | --- | --- | --- |
| 11x000 | 110000 | 11 | 6 | 2 | 5 | 2 |
| 11x000 | | | 6 | 2 | 5 | 2 |
| 11x0x0 | | | 6 | 2 | 4 | 2 |
| 11x00x | | | 6 | 2 | 4 | 2 |
| 1x00xx | | | 6 | 2 | 3 | 2 |
| 1xxxxx | | | 6 | 2 | 1 | 2 |
| x1xxxx | | | 6 | 2 | 1 | 2 |
| 010x01 | 010001 | 101 | 6 | 3 | 5 | 3 |
| 01x0x1 | | | 6 | 3 | 4 | 3 |
| x1x001 | | | 6 | 3 | 4 | 3 |
| xxxxx1 | | | 6 | 3 | 1 | 3 |
| 10xx0x | 100100 | 100 | 6 | 3 | 3 | 3 |
| x00xxx | | | 6 | 3 | 2 | 3 |
| xxx1x0 | | | 6 | 3 | 2 | 3 |
| 101110 | 101110 | 0101101 | 6 | 7 | 6 | 7 |
| 101110 | | | 6 | 7 | 6 | 7 |
| 00xxx0 | 00xxx0 | 000xxx0 | 6 | 7 | 3 | 4 |
| 0xxxx1 | 0xxxx1 | 00xxxx1 | 6 | 7 | 2 | 3 |
| | | | 108 | 63 | 61 | 56 |

As shown above, a set of blocks that do not conflict in any bit position can be grouped together and represented by a group pattern that is compatible with every block in the group. There are 6 groups in Table 1, with each group pattern shown in the second column. The illustrated grouping is not unique, in that there are many different ways to group the test data blocks. However, one skilled in the art will understand that if the largest possible group is formed first, and then the next largest possible group, and so forth, then an optimal Huffman code can be constructed to obtain the minimum total number of bits after coding.

As used herein, a Huffman code is generally a prefix-free code, wherein no codeword is a prefix of any other codeword in the set of codewords, as one skilled in the art will understand. The present invention can also be configured for prefix-free codes that are not strictly Huffman codes, in that the accepted Huffman algorithm need not be employed to generate the codewords. In other words, the present invention may be practiced such that prefix-free codes are used to generate the codewords, and it is not limited to Huffman codes. The term "Huffman codes" is used herein to refer to both strict Huffman codes and prefix-free codes generally.

The embodiment illustrated in Table 1 assumes that only three groups would be encoded, with all other test data groups left unencoded. The first bit of each codeword embodies this distinction. If the first bit of the codeword is 0, the remaining bits in the codeword are the unencoded data itself. If the first bit of the codeword is 1, the remaining bits are encoded data. Accordingly, as shown in Table 1, the codewords 11, 101, and 100 encode the three largest test data block groups. The other groups remain unencoded and so test system 104 appends a bit, set to 0, on the most-significant side of the codeword, indicating that the remaining bits in the codeword are unencoded test data.

As shown in Table 1, before encoding, there are 108 total bits in all the test data blocks. After encoding, there are 63 total bits in all the codewords. Thus, the test system illustrated in Table 1 compressed the data from 108 bits to 63 bits. However, since the test system uses a linear compressor to generate the codewords, the final compression depends on how many specified bits the linear compressor generates and not the total number of bits. As shown in Table 1, there are 61 total specified bits before encoding. After encoding, there are 56 total number of specified bits. Thus, the test system illustrated in Table 1 reduces the number of specified bits generated by the linear compressor from 61 to 56.

While the encoding in Table 1 is optimal for minimizing the total bits after coding, it is not optimal for minimizing the total specified bits after coding. Table 2 illustrates this point, showing a different encoding for the exact same set of test data blocks.

TABLE 2

Optimal Statistical Code With 3 Groups Encoded to Minimize Total Specified Bits

| Blocks | Group Pattern | Codeword | Total Bits Before Coding | Total Bits After Coding | Specified Bits Before Coding | Specified Bits After Coding |
|---|---|---|---|---|---|---|
| 11x000 | 110000 | 11 | 6 | 2 | 5 | 2 |
| 11x000 | | | 6 | 2 | 5 | 2 |
| 11x0x0 | | | 6 | 2 | 4 | 2 |
| 11x00x | | | 6 | 2 | 4 | 2 |
| 1x00xx | | | 6 | 2 | 3 | 2 |
| 1xxxxx | | | 6 | 2 | 1 | 2 |
| x1xxxx | | | 6 | 2 | 1 | 2 |
| 010x01 | 010001 | 101 | 6 | 3 | 5 | 3 |
| 01x0x1 | | | 6 | 3 | 4 | 3 |
| x1x001 | | | 6 | 3 | 4 | 3 |
| xxxxx1 | xxxxx1 | 0xxxxx1 | 6 | 7 | 1 | 2 |
| 10xx0x | 10xx0x | 010xx0x | 6 | 7 | 3 | 4 |
| x00xxx | x00xxx | 0x00xxx | 6 | 7 | 2 | 3 |
| xxx1x0 | xxx1x0 | 0xxx1x0 | 6 | 7 | 2 | 3 |
| 101110 | 101110 | 100 | 6 | 3 | 6 | 3 |
| 101110 | | | 6 | 3 | 6 | 3 |
| 00xxx0 | 00xxx0 | 000xxx0 | 6 | 7 | 3 | 4 |
| 0xxxx1 | 0xxxx1 | 00xxxx1 | 6 | 7 | 2 | 3 |
| | | | 108 | 71 | 61 | 48 |

In Table 2, the illustrated test system encodes the fourth largest group from Table 1 (corresponding to group pattern 101110), and leaves the third largest group from Table 1 (corresponding to group pattern 100100) unencoded. This approach better minimizes specified bits because the fourth largest group contains more specified bits (12) than the third largest group (9), even though the fourth largest group has one less test data block than the third largest group (2 blocks versus 3 blocks).

Additionally, the test system illustrated in Table 2 excludes block xxxxx1 from codeword 101, even though the block conforms to group pattern 010001. As shown encoded the block with codeword 101 it requires 3 specified bits. Unencoded transmission, however, (i.e., 0xxxxx1), requires only 2 specified bits. As shown, the test system illustrated in Table 2 requires 71 total bits after coding, more than the 63 required for the Table 1 system. The Table 2 test system only requires 48 specified bits, a clear improvement over the 56 specified bits required by the Table 1 system. As shown in more detail below, the Table 2 system, illustrated test system 104, provides advantages over the Table 1 system because the resulting codewords can be more efficiently compressed with a linear compressor, as the codewords contain fewer specified bits.

Specifically, test system 104 comprises a number of modules that together provide a systematic mechanism and procedure for selecting a statistical code to minimize the total number of specified bits after coding in a test data stream. As described above, test system 104 includes test data (test cube) generator 110, which, among other things, generates test cubes.

A test cube pair analyzer (TCPA) 120 groups and pairs the generated test cubes as follows. Generally, TCPA 120 compares each test cube with at least one other test cube, as a test cube pair, and generates a compatibility rating for each compared test cube pair. TCPA 120 then arranges the compared test cube pairs in an order based on the compatibility ratings of the pairs. TCPA 120 groups the two test cubes that comprise the compared test cube pair with the highest compatibility rating into a test cube set for further processing. Likewise, TCPA 120 groups the remaining test cubes into test cube sets, as test cube pairs, based on the compatibility ratings of the compared test cube pairs.

TABLE 3

Example Test File with Six Test Cubes

| Test Cube Name | Test Cube |
|---|---|
| A | XXXX01X111010010100XXXXXXXXXXXXXXXXXXXXXXX01010000XXXXXX |
| B | XXXXXXX111XXX01010010XXXXXXXXXXXXXXXXXXXXXX01010000XXXXXX |
| C | XXXX01XXXXXXXXX01111011100XXXXXXXXXXXXXXXXX00000000XXXXXX |
| D | XXXX01X111010010100111111XXXXXXXXXXXXXXXXX00010011XXXXXX |
| E | XXXX01X1111111110010XXXXXXXXXXXXX0001100011001010XXXXXX |
| F | XXXX01X110XXX0X0X0X0XXXXXXXXXXXXXXXXXXXXX0011111110000XXXXXX |

For example, in one embodiment, TCPA 120 compares each test cube with every other test cube in a plurality of generated test cubes. Table 3 illustrates an example test file with six test cubes, "A", "B", "C", "D", "E", and "F". For the test file illustrated in Table 3, TCPA 120 compares the test cubes as the following fifteen pairs: A:B, A:C, A:D, A:E, A:F, B:C, B:D, B:E, B:F, C:D, C:E, C:F, D:E, D:F, and E:F. TCPA 120 generates a compatibility rating for each of the fifteen compared pairs.

In particular, TCPA 120 generates a compatibility rating based on the number of specified bit positions that are of different specification within the compared pair. In one embodiment, the compatibility rating is a percentage representing the number of compatible bit positions divided by the total number of bit positions, where a bit can be one of the values, "1", "0", and "X". In the example test file shown in Table 3, the test cube pair A:B has a compatibility rating of 1 (or 56/56), because test cubes A and B are compatible in every bit position. Similarly, the test cube pair D:E has a compatibility rating of 0.7857 (or 44/56), because test cubes D and E are compatible in only 44 of their 56 bits.

Next, TCPA 120 groups the compared test cube pairs into test cube sets based on the compatibility ratings. In one embodiment, the pair with the highest compatibility rating, or Highest-Rated Remaining Pair (HRP) is grouped into a test cube set, then the pair with the next highest compatibility rating is grouped into another test cube set, followed by the next highest-rated pair, and so forth until all test cubes have been grouped in pairs into a test cube set.

In an alternate embodiment, only the test cube pair with the highest compatibility rating is grouped into a test cube set, and the remaining test cubes are encoded as individual test cubes. In an alternate embodiment, the test cubes other than the HRP are re-compared and new compatibility ratings are taken after the HRP is grouped into a test cube set. The remaining HRP is then grouped into a test cube set and the process repeats as each successive HRP is set aside in a separate test cube set.

In one embodiment, TCPA 120 only groups into sets those pairs with a compatibility rating above a certain pre-determined threshold value. Test group pairs with compatibility ratings below the pre-determined threshold value remain ungrouped and are encoded individually or collectively based on a default or selected encoding.

In an alternate embodiment, where two or more compared pairs have the same highest compatibility rating, TCPA 120 groups all compared pairs with the same highest compatibility rating, as pairs, into test cube sets, followed by those pairs with the same next-highest rating, and so forth. In an alternate embodiment, TCPA 120 selects one of the two or more pairs based on a number of secondary criteria. In one embodiment, the secondary criteria include the number of specified bits. In an alternate embodiment, the secondary criteria are random assignments. In another alternate embodiment, the secondary criteria include a user-provided algorithm. One skilled in the art will recognize other suitable secondary criteria.

In an alternate embodiment, TCPA 120 further tests all pairs with the same highest compatibility rating to determine whether the pairs are also inter-compatible. For example, where pairs A:B and C:D both have a compatibility rating of 1, then if pair B:C and A:D also have a compatibility rating of 1, TCPA 120 groups test cubes A, B, C, and D all together in a single test cube set. Otherwise TCPA 120 groups the pairs into test cube sets as A:B and C:D.

In an alternate embodiment, TCPA 120 tests groups of three test cubes for compatibility, and generates compatibility ratings based on groups of three test cubes. In one such embodiment, TCPA 120 groups only those groups of three with a compatibility rating of 1 into test cube sets.

In an alternate embodiment, TCPA 120 arranges the test cubes into test cube sets according to a pre-determined number of decoder modes. Generally, "decoder modes" are operating configurations for the end-use decoder, that is, the decoder that will receive compressed encoded test data 106 and decode/decompress the received data at test time to generate test data for the scan chains, as described in more detail below.

The number of available decoder modes depends on the specific decoder employed. The number of different codeword sets and encoding schema available to test system 104 depends on the number of available decoder modes. In embodiments with more than one available decoder mode, test system 104 can employ fewer than the available decoder modes. In a preferred embodiment, test system 104 uses three decoder modes. In one embodiment, processor 112 determines the number of decoder modes. In a particular embodiment, user-provided user input determines the number of decoder modes.

Generally, where there is only one available decoder mode, test system 104 (specifically TCPA 120, in one embodiment) determines compatibility codewords based on the single highest-rated paired test cubes. The remaining test cubes can then be optimized based on the codewords selected for the highest-rated paired test cubes. In typical embodiments, test system 104 uses the first three available decoder modes, assigning codewords for each mode based on the three highest-rated paired test cubes.

Thus, generally TCPA 120 groups test cubes into test cube sets based on a variety of criteria, as described above. With the test cubes arranged into sets, test system 104 generates one or more encoding schema as codeword sets for at least the first HRP test cube set. The codeword generation and encoding process is also iterative and can be repeated for each employed decoder mode.

Generally, for each employed decoder mode, test system 104 uses a default (or generated) initial codeword set, then groups and encodes blocks of test data (from the test cube set) based on the initial codeword set, and computes the achieved compression. Test system 104 then generates a new set of codewords, then groups/encodes the test data blocks based on the new codeword set, and computes the achieved compression. This process continues until the newest codeword set yields no compression improvement. Test system 104 then encodes the test cube set under consideration with the identified codeword set and enqueues the encoded test cube set for subsequent compression.

Test system 104 then repeats the process for each employed decoder mode. In one embodiment, test system 104 encodes test cube sets that exceed the number of employed decoder modes with the codeword set established for the next highest HRP relative to the remaining test cube sets. In an alternate embodiment, test system 104 encodes excess test cube sets with the codeword set established for the first HRP. One skilled in the art will recognize other suitable configurations.

Thus, test system 104 generally applies an iterative procedure for finding statistical code that minimizes the total number of specified bits. One skilled in the art will understand that there is some cyclical dependency, in that grouping the blocks depends on the codewords, while selecting the codewords depends on how the blocks are grouped. Thus, test system 104 uses an iterative procedure, first assuming an initial set of codewords and then grouping the blocks. Based on the grouping, test system 104 selects a new codeword set. Using the new set of codewords, test system 104 re-groups the blocks.

Test system 104 repeats this process as long as the compression continues improving.

As described above, test system 104 generates initial codewords to begin the process. Test system 104 includes codeword generator 130. Codeword generator 130 generates the initial codeword set based on a default codeword set, a generated codeword set, or other suitable criteria.

In one embodiment, the initial codeword set corresponds to a "step-tree." One skilled in the art will understand that a step-tree is a coding scheme in which the codewords "step up" by one specified bit for each consecutive codeword. An example step-tree includes: "10XXXXX", "110XXXX", "1110XXX", "11110XX", "111110X", and "1111110". As described above, the codeword with only one specified bit (i.e., "0X~") is reserved for blocks that will not be encoded. Thus, the shortest codeword available for coded blocks has a length of two specified bits. In one embodiment, the default codeword set is a step-tree.

Codeword generator 130 stores the initial generated codewords as current codewords 132. Codeword generator 130 resets the previous codewords 134, if any, on the first pass. In one embodiment, on the first pass, codeword generator 130 resets the previous codewords 134 after storing the initial codeword set as current codewords 132. As test system 104 moves through the iterations of the codeword set generation and encoding process, codeword generator 130 stores current codewords 132 to previous codewords 134, and generates a new codeword set near the beginning of each iteration, as described in more detail below.

In one embodiment, codeword generator 130 generates the codewords in each iteration. In an alternate embodiment, codeword generator 130 is a discrete component of, or represents functionality of compression analyzer 136.

Test system 104 includes compression analyzer 136. Compression analyzer 136 groups the test data blocks in the current test cube set according to the current codewords 132. As described above, the grouping depends on the codewords because if the number of specified bits in a block is less than the number of specified bits in the corresponding codeword, then the block should not be coded because it would be equally or more efficient to simply leave the block unencoded. In one embodiment, test system 104 does not encode test data blocks that, unencoded, comprise fewer specified bits than the codeword to which those test data blocks would otherwise be assigned.

Table 2, above, illustrates this point, in showing block xxxxx1, which is compatible with the group pattern 010001 and thus could be encoded with 101xxxx. Table 2 shows, however, that it is more efficient to leave that block unencoded, (i.e., encode it as "0xxxxx1"), which requires fewer specified bits. Therefore, in one embodiment, test system 104 applies a general guideline: when forming the i-th group corresponding to the i-th most specified codeword, if the number of specified bits in the i-th most specified codeword is s, then no block with fewer than s specified bits should be added to the group.

Compression analyzer 136 forms the test data block groups one at a time, adding one block at a time. All blocks that are compatible with the current group and have the same or more specified bits than the group are candidates to add to the group. One skilled in the art will understand that each group is initially empty, and thus all blocks are compatible with it. Generally, in one embodiment, compression analyzer 136 uses a lookahead procedure to decide which candidate block to add to the group by considering how many blocks would remain compatible with the group after each candidate block is added. Compression analyzer 136 then adds to the group the candidate block that would preserve the most compatibility as compared with the other remaining blocks. In one embodiment, compression analyzer 136 adds blocks one by one to a group until there are no more candidate blocks to add to the group. In the same manner, Compression analyzer 136 constructs the remaining groups of test cube blocks of the current test cube set.

Once compression analyzer 136 has formed all the groups in the test cube set, compression analyzer 136 computes the achieved compression with respect to the number of specified bits. Specifically, in one embodiment, compression analyzer 136 replaces the encoded groups with their corresponding codewords and adds the extra "0" bit to the MSB position of the unencoded blocks, indicating that they are unencoded. Compression analyzer 136 then computes the total number of specified bits after encoding. If the compression of specified bits achieved in the current iteration is the same as that compression achieved in the last iteration, then the process continues as described in more detail below. Otherwise, compression analyzer 136 repeats the process, as described above, beginning with a new set of codewords.

In one embodiment, compression analyzer 136 uses the currently-formed groups to generate the new set of codewords. In a particular embodiment, using the groups formed in the prior iteration, compression analyzer 136 uses the "frequency" of each group to construct new codewords based on a Huffman tree. In this instance, the "frequency" analyzed in this part of the process is the frequency of specified bits, which is equal to the total number of specified bits across all the blocks contained in the group. Compression analyzer 136 uses this "frequency" to build a Huffman tree, from which compression analyzer 136 obtains the new codewords. As described above, test system 104 employs selective encoding, and therefore some test data block groups are not encoded.

Once compression analyzer 136 has generated the new codewords, compression analyzer 136 moves or otherwise writes the current codewords 132 to the previous codewords 134 and the new codewords to the current codewords 132. Compression analyzer 136 again groups the blocks based on the (now new) current codewords 132, and compares the achieved compression with that attained using the previous codewords 134 (i.e., in the prior iteration). As described above, based on that determination, in one embodiment, compression analyzer 136 either begins another iteration or completes processing of the current test cube set.

Where encoding with the current codewords 132 shows no improvement in achieved compression over that attained through use of previous codewords 134, compression analyzer 136 encodes the test cube set using current codewords 132 and sends the encoded test cube set to encoded test cube queue (ETCQ) 140. In one embodiment, compression analyzer 136 performs a subsequent encoding on the current test cube set before transmission to ETCQ 140, that is, the current test cube set is freshly encoded using the current grouping and current codewords 132. In an alternate embodiment, compression analyzer 136 sends the test cube set to ETCQ 140 as encoded for achieved compression analysis. That is, in one embodiment, having identified that the current compression does not show further improvement over the prior compression, compression analyzer 136 sends the test cube set as it is thus compressed to ETCQ 140, without recompression.

As described above, in one embodiment, test system 104 performs this iterative procedure of codeword generation and compression comparison for each employed decoder mode. For each employed decoder mode, test system 104 settles on a codeword set (through the process described above) for the test cube set under consideration, encodes that test cube set, and enqueues the encoded test cube set in ETCQ 140. Thereafter, test system 104 employs the determined codewords for that decoder mode. As described above, in some embodiments, test system 104 uses only one decoder mode.

Where test system 104 uses only one decoder mode, in one embodiment, test system 104 encodes at least the test cube set used to generate the codewords (the test cube HRP). In one embodiment, test system 104 also encodes the remaining test cubes, as individual test cubes or as test cube pairs, with the codewords used to encode the HRP. In one embodiment, test system 104 also employs selective encoding on these remaining test cubes, wherein test cube blocks with fewer specified bits than their associated codeword are transmitted unencoded (i.e., in the form "0X~"), as described above. In an alternate embodiment, test system 104 encodes the HRP test cubes and transmits the remaining test cubes unencoded.

Where test system 104 uses more than one decoder mode, in one embodiment, test cubes not employed to generate codewords are encoded with the codewords associated with the test cube HRP. In an alternate embodiment, test system 104 encodes those test cubes not employed to generate codewords with the codewords associated with the least highest-rated test cube pair that was employed to generate codewords. In an alternate embodiment, compression analyzer 136 tests each test cube not employed to generate codewords with each set of decoder mode codewords, encoding the remainder test cubes with whichever decoder mode codewords achieve the highest reduction in specified bits. In an alternate embodiment, test system 104 transmits those test cubes not employed to generate codewords unencoded.

In one embodiment, it is possible for some individual test cubes to not achieve positive compression (i.e., to end up with more specified bits), even though the overall test set does achieve significant compression. That is, the extra "0" bit used to indicate unencoded test cubes is itself an added specified bit. Therefore, if the proportion of encoded blocks to unencoded blocks in a particular test cube is not sufficiently high, that test cube may not achieve positive compression.

Therefore, in such cases where some test cube under consideration fail to meet a predetermined threshold ratio of encoded-to-unencoded blocks, in one embodiment, test system 104 enqueues such test cubes entirely without encoding, appending them to ETCQ 140 after every other test cube in the data set has been encoded. In this instance, "entirely without encoding" means "without the added 0 bit," and, in one embodiment, comprises a distinct decoder mode.

As described above, when test system 104 has enqueued each test cube set in ETCQ 140, whether encoded, unencoded, or entirely without encoding, linear compressor 142 compresses the enqueued test cubes, to generate compressed encoded test data 106. Linear compressor 142 is an otherwise conventional linear compressor as one skilled in the art will understand. In an alternate embodiment, linear compressor 142 compresses the test cubes in ETCQ 140 when the test cubes in ETCQ 140 reach a predetermined number of specified bits.

Where test system 104 uses more than one decoder mode, in one embodiment, linear compressor 142 inserts a decoder mode indicator within the test cube data stream at the beginning of each decoder mode represented in the test cubes, as they are in ETCQ 140. In an alternate embodiment, linear compressor 142 sets a separate decoder mode bit or other indicator in a register accessible by the target system for which the compressed encoded test data 106 are destined.

Figure 2:
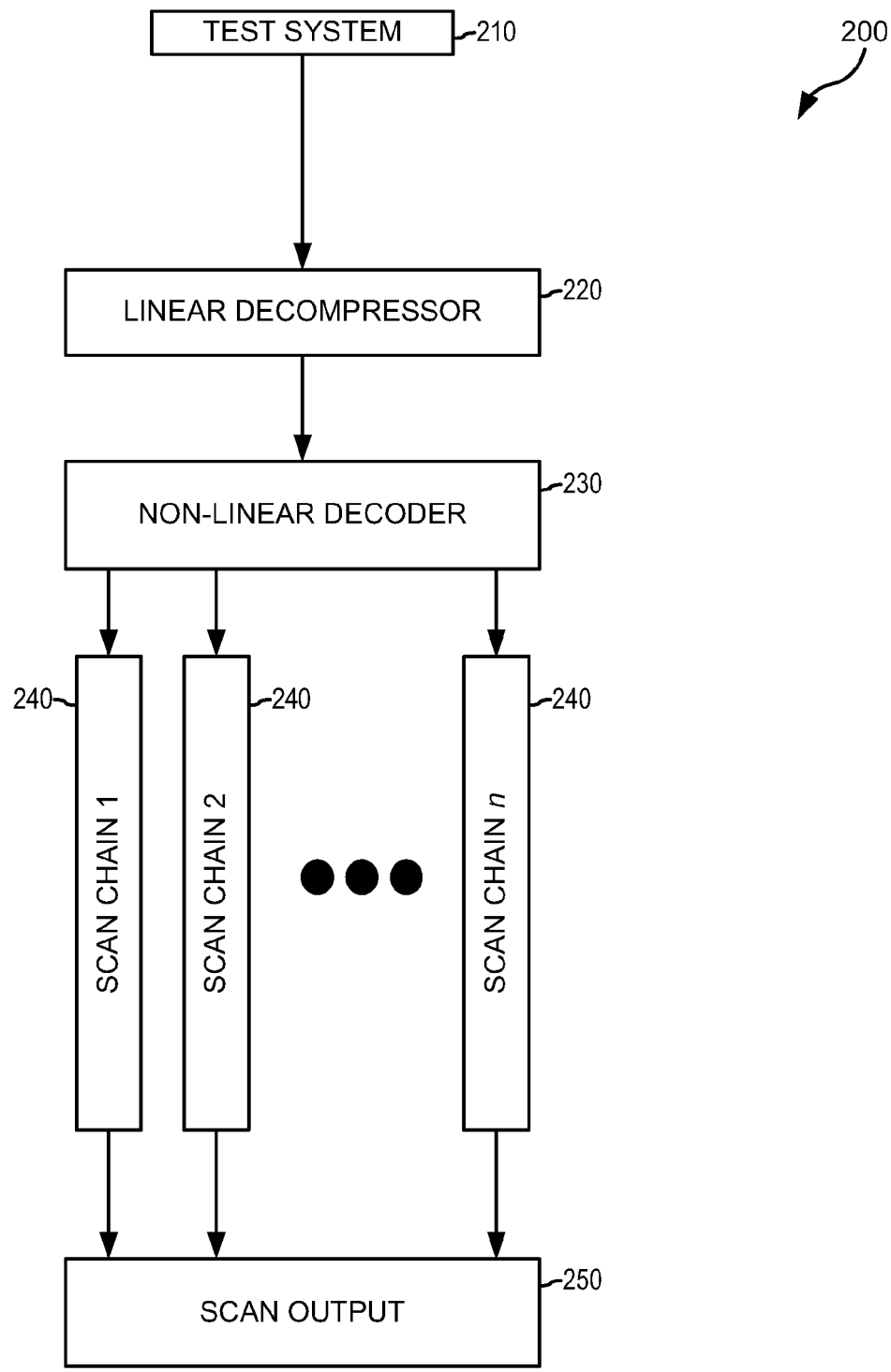
FIG. 2 illustrates a block diagram showing an exemplary test data decompression system in accordance with a preferred embodiment.

Thus, as described above, in one embodiment, test system 104 generates compressed encoded test data 106 for use in a test system, such as, for example, test system 200 of FIG. 2.

FIG. 2 illustrates a block diagram showing an exemplary test data decompression system in accordance with a preferred embodiment, generally indicated by reference numeral 200.

Test system 200 includes test system 210. Generally, test system 210 is a test system 100 as described in FIG. 1. Test system 210 generates compressed encoded test data and transmits compressed encoded test data to linear decompressor 220.

Linear decompressor 220 is an otherwise conventional linear decompressor. In one embodiment, linear decompressor 220 receives compressed encoded test data, generates decompressed encoded test data, and transmits decompressed encoded test data to non-linear decoder 230. In one embodiment, linear decompressor 220 includes a queue and transmits decompressed encoded test data to non-linear decoder 230 in segments. In one embodiment, linear decompressor 220 determines the decoder mode associated with the decompressed encoded test data and sends a decoder mode signal to non-linear decoder 230 based on the associated decoder mode. In one embodiment, linear decompressor 220 transmits decompressed encoded test data to non-linear decoder 230 is segments associated with a single decoder mode, along with an indication of the associated decoder mode.

Generally, non-linear decoder 230 is an otherwise conventional decoder, except as modified herein. In particular, non-linear decoder 230 receives the decompressed encoded test data and, based on the codewords associated with the decoder mode applicable to the encoded test data, decodes the encoded test data to generate test data. As described above, non-linear decoder 230 can operate in more than one decoder mode. In one embodiment, non-linear decoder 230 operates in a fixed number and configuration of decoder modes. In an alternate embodiment, non-linear decoder 230 operates in a plurality of decoder modes, each of which is programmable based on the desired codeword set as determined by test system 210, as described above.

Thus, generally, in one embodiment, non-linear decoder 230 transmits decompressed decoded test data to one or more of scan chains 240. Scan chains 240 are otherwise conventional scan chains, and transmit scan data to scan output 250. Scan output 250 is an otherwise conventional scan output 250 and can comprise a register, as one skilled in the art will understand. In a preferred embodiment, scan output 250 comprises a Multiple Input Signature Register (MISR), as one skilled in the art will understand. In an alternate embodiment, scan output 250 is another "compression" set of logic that reduces the total number of compares required.

Figure 3A:
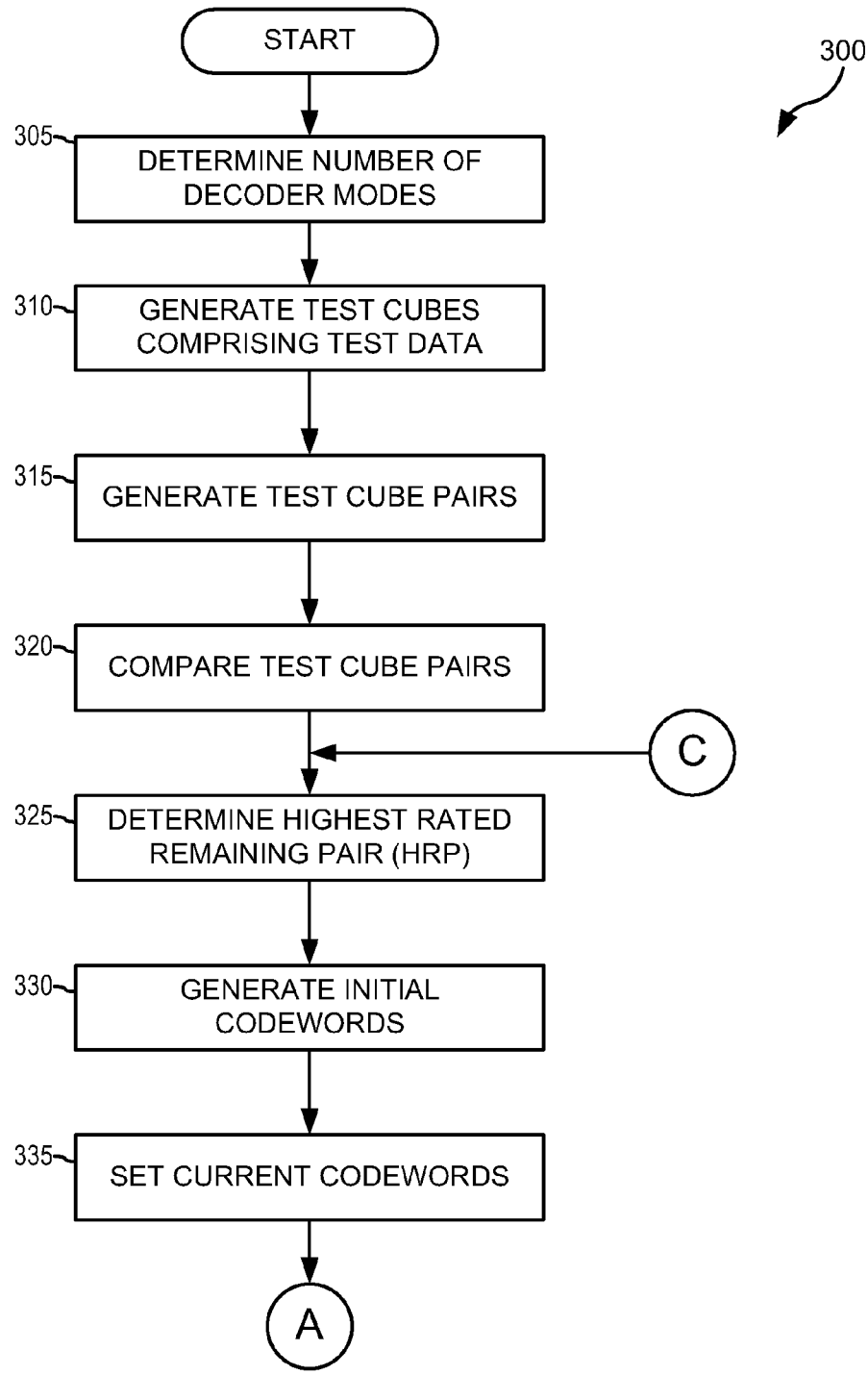
FIGS. 3A-3C illustrate a high-level flow diagram depicting logical operational steps of a test data compression method, which can be implemented in accordance with a preferred embodiment.
Figure 3B:
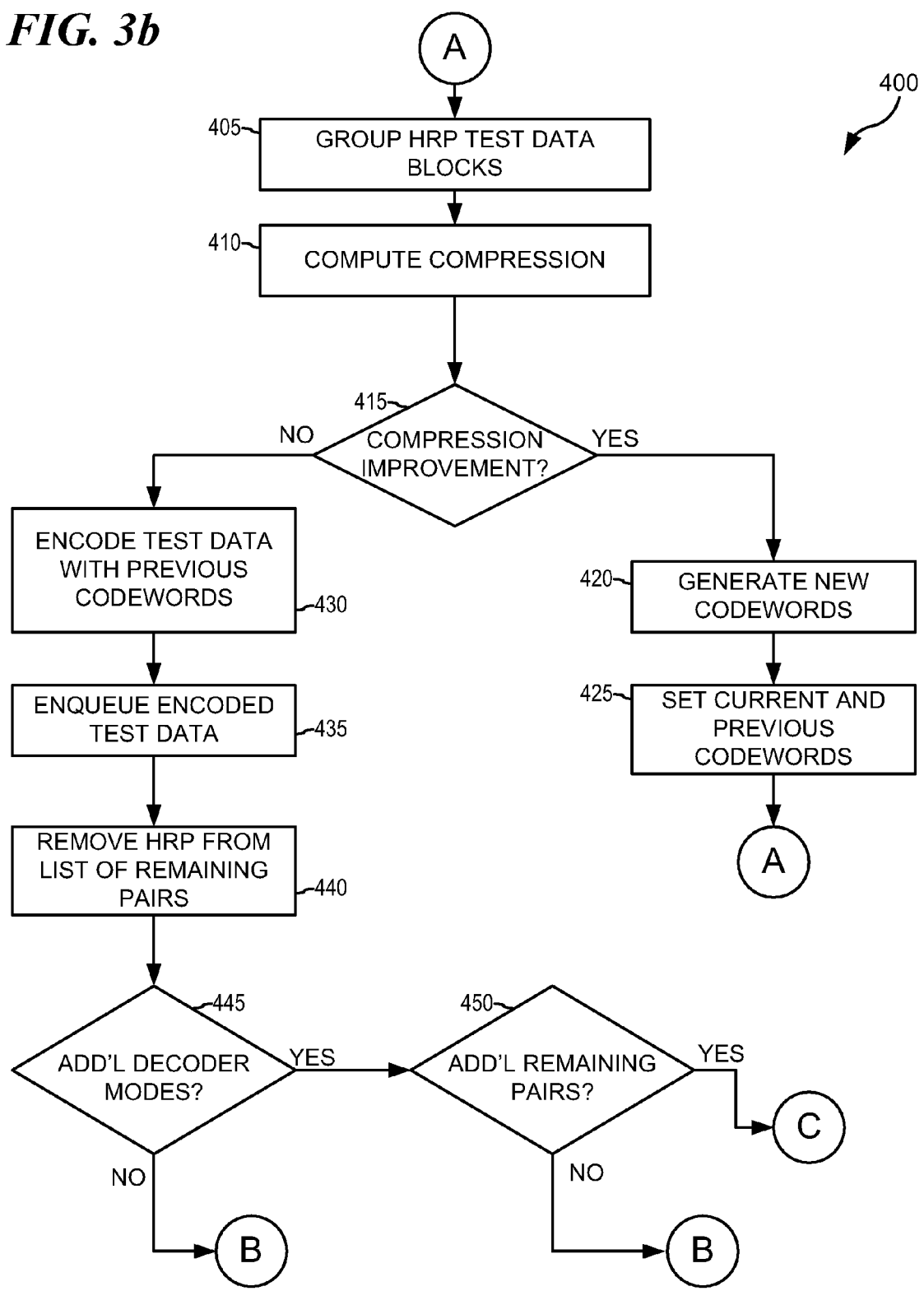
Figure 3C:
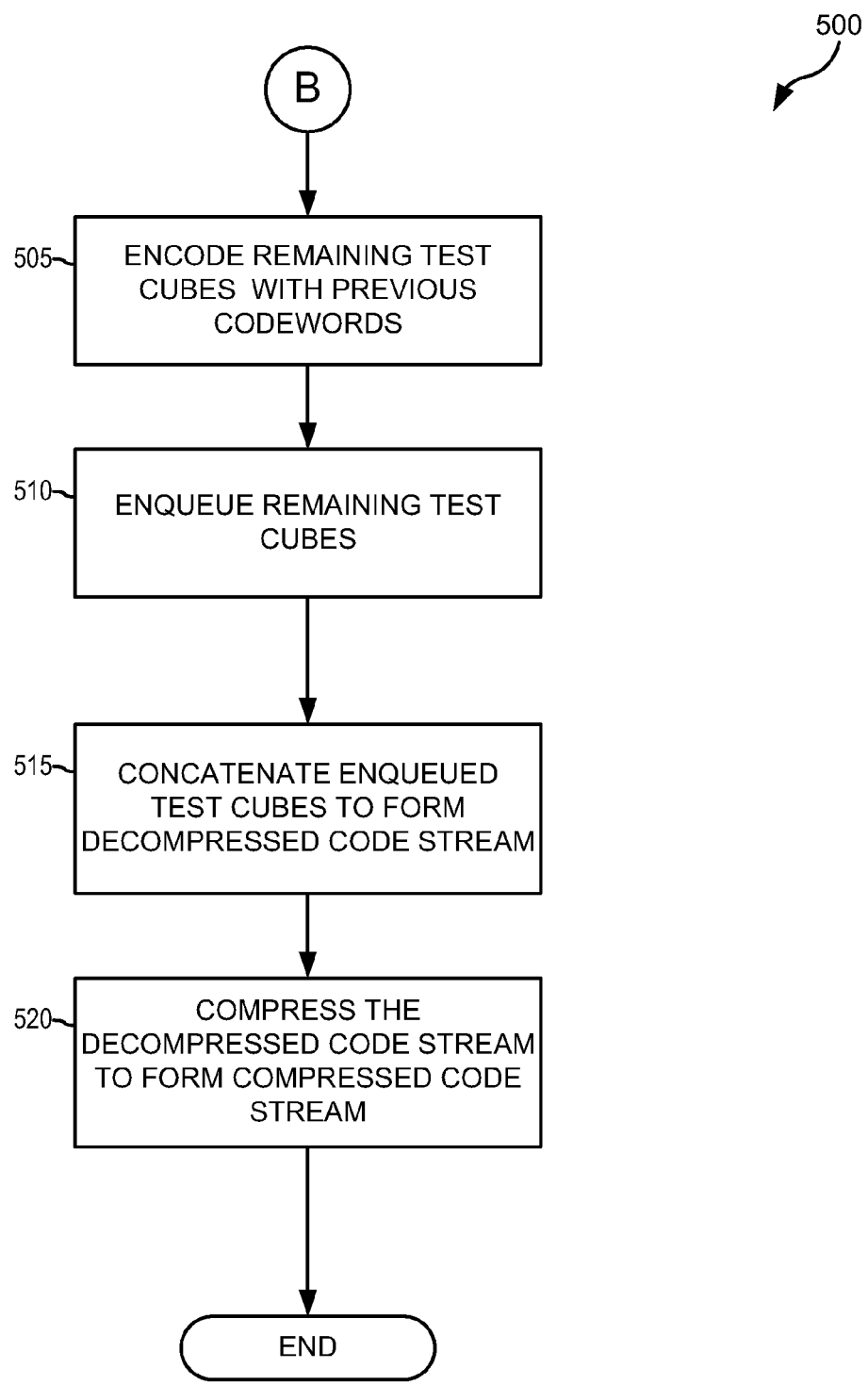

As described above, the present inventions embody novel systems and methods to improve test data compression. FIGS. 3a through 3c illustrate one embodiment of a method to improve test data compression. Specifically, FIG. 3a illustrates a high-level flow chart 300 that depicts logical operational steps performed by, for example, system 100 of FIG. 1, which may be implemented in accordance with a preferred embodiment.

As indicated at block 305, the process begins, wherein the test system, such as, for example, test system 104 of FIG. 1, determines the number of decoder modes available. As described above, test system 104 can make this determination based on user input or a pre-determined setting.

Next, as illustrated at block 310, the test data generator, such as, for example, test data generator 110 of FIG. 1, generates test cubes for application to the target scan chains. Next, as illustrated at block 315, the test cube pair analyzer, such as, for example, TCPA 120 of FIG. 1, groups test cubes into pairs for compatibility analysis.

Next, as illustrated at block 320, TCPA 120 compares the test cubes in the test cube pairs for compatibility. In one embodiment, TCPA 120 generates a compatibility rating, as described above. Next, as illustrated at block 325, TCPA 120 determines the test cube pair with the highest compatibility rating, the "HRP." In one embodiment, TCPA 120 groups the HRP into a test cube set and passes the test cube set to a compression analyzer for subsequent processing, as described above.

Next, as illustrated at block 330, the compression analyzer, such as, for example, compression analyzer 136 of FIG. 1, generates initial codewords for the current test cube set. As described above, in the first iteration of this process, the first current test cube set is the highest HRP. Additionally, a codeword generator can also perform this step, as described above. Next, as illustrated at block 335, compression analyzer 136 sets the current codewords, such as, for example, current codewords 132, based on the initial codewords. In one embodiment, as described above, compression analyzer 136 also clears the previous codewords in this step. The process continues to marker "A", of FIG. 3b.

FIG. 3b illustrates a high-level flow chart 400 that depicts logical operational steps performed by, for example, system 100 of FIG. 1, which may be implemented in accordance with a preferred embodiment. The process begins at marker "A", from FIG. 3a, as described above.

Next, as illustrated at block 405, the compression analyzer, such as, for example, compression analyzer 136 of FIG. 1, groups the HRP (or otherwise the test cube under consideration) into test data blocks based on the current codewords, as described above. Next, as illustrated at block 410, the compression analyzer computes the compression achieved through the current codewords.

Next, as illustrated at decisional block 415, compression analyzer 136 determines whether the current compression represents an improvement over the previous achieved compression. If the current compression represents an improvement over the previous achieved compression, the process follows the YES branch to block 420.

As illustrated at block 420, compression analyzer 136 generates new codewords. Next, as illustrated at block 425, compression analyzer 136 sets the current codewords and the previous codewords, and the process returns to marker "A".

If the current compression does not represent an improvement over the previous achieved compression, the process follows the NO branch to block 430. As illustrated at block 430, compression analyzer 136 encodes the current test data set with the previous codewords. In an alternate embodiment, compression analyzer 136 encodes the current test data set with the current codewords.

One advantage to using the previous codewords is that in some instances the current codewords will result in a compression degradation over the previous codewords, in which case, in one embodiment, the test system uses the previous codewords. Another advantage is that for certain test cube sets that do not achieve positive compression, the "previous codewords" are no codewords at all, as the first pass will generally indicate that that particular test cube set contains less specified bits if transmitted entirely without encoding, as described above.

Next, as illustrated at block 435, compression analyzer 136 enqueues the encoded test cube set. In one embodiment, compression analyzer 136 enqueues the encoded test cube set in ETCQ 140 of FIG. 1. Next, as illustrated at block 440, since the HRP test cube pair is encoded, compression analyzer 136 removes the highest HRP (the current test cube set on the first iteration) from the list of remaining test cubes.

Next, as illustrated at decisional block 445, compression analyzer 136 determines whether there are additional available decoder modes. If there are no additional available decoder modes, the process continues along the NO branch to marker "B", shown in FIG. 3c. If there are additional available decoder modes, the process continues along the YES branch to block 450.

Next, as illustrated at decisional block 450, compression analyzer 136 determines whether there are additional remaining test cubes or test cube pairs. If there are no remaining test cubes or test cube pairs, the process continues along the NO branch to marker "B", shown in FIG. 3c. If there are additional remaining test cubes or test cube pairs, the process continues along the YES branch to marker "C", which leads to block 325 of FIG. 3a, described above.

FIG. 3c illustrates a high-level flow chart 500 that depicts logical operational steps performed by, for example, system 100 of FIG. 1, which may be implemented in accordance with a preferred embodiment. The process begins at marker "B", from FIG. 3b, as described above.

As illustrated at block 505, in the illustrated embodiment, compression analyzer 136 encodes the remaining test cubes with the previous codewords. One skilled in the art will understand that, in alternate embodiments, compression analyzer 136 can instead enqueue the remaining test cubes unencoded, or using a different set of codewords, according to a prior decoder mode, as described above.

Next, as illustrated at block 510, compression analyzer 136 enqueues the remaining test cubes (encoded or otherwise). Next, as illustrated at block 515, a linear compressor, such as, for example, linear compressor 142 of FIG. 1, concatenates the enqueued test cubes to generate a decompressed code stream. On skilled in the art will understand that at this step, the concatenated test cubes are "decompressed" in the sense that they are presently uncompressed.

Next, as illustrated at block 510, the linear compressor 142 compresses the decompressed code stream to form a compressed code stream and the process ends. In an alternate embodiment, the test system transmits the compressed code stream to a target system for decompression, decoding, and deployment through one or more scan chains. FIG. 4 illustrates the target system processes.

FIG. 4 illustrates a high-level flow chart 600 that depicts logical operational steps performed by, for example, system 200 of FIG. 2, which may be implemented in accordance with a preferred embodiment.

As indicated at block 605, the process begins, wherein the test system, such as, for example, test system 200 of FIG. 2, receives a compressed test stream. In a particular embodiment, linear decompressor 220 of FIG. 2 receives the compressed test stream. Next, as indicated at block 610, linear decompressor 220 decompresses the compressed test stream, to form a decompressed test stream. At this point, the decompressed test stream is generally in the same state as it was after step 515 of FIG. 3c above.

Next, as indicated at block 615, the test system determines the decoder mode applicable to the current segment or n-bit block of the decompressed test stream. As described above, in one embodiment, linear decompressor 220 determines the decoder mode and sets an indicator signal to non-linear decoder 230. In an alternate embodiment, non-linear decoder 230 determines the decoder mode based on an indication from test system 210, a pre-determined sequence in the decompressed test stream, or other suitable mechanism, as described above.

Next, as indicated at block 620, non-linear decoder 230 decodes the current test stream block according to the determined decoder mode. Next, as indicated at block 625, non-linear decoder 230 transmits the decoded test stream block to one or more scan chains for testing. One skilled in the art will understand that a variety of otherwise conventional test circuitry and/or equipment can be implemented downstream from the scan chain.

Next, as indicated at decisional block 630, non-linear decoder 230 (or, in an alternate embodiment, linear decompressor 220) determines whether the test system has reached the end of the test stream. If the test system has reached the end of the test stream (i.e., there is no more test data to process), the process continues along the YES branch, where it ends.

If the test system has not reached the end of the test stream, the process continues along the NO branch to decisional block 635. As indicated at decisional block 635, non-linear decoder 230 (or, in an alternate embodiment, linear decompressor 220) determines whether a new decoder mode is associated with the next test stream block.

If the next test stream block is associated with a new decoder mode, the process continues along the YES branch to block 615, wherein non-linear decoder 230 determines the decoder mode. If the next test stream block is not associated with a new decoder mode, the process continues along the NO branch to block 640.

Next, as illustrated at block 640, the linear decompressor 220 advances the next test stream block to the current test stream block, and the process returns to block 620, as indicated by marker, "D." As described above, the process continues until there are no additional test stream blocks, as determined in block 630 and the process ends.

Accordingly, the embodiments provide for a test system that performs statistical transformations on generated test cubes using non-linear hardware/software to reduce the number of specified bits that need to be encoded by the linear compressor, generally by exploiting correlations in the test data. Given a test cube data set destined for application in scan chains, the present invention provides a systematic procedure for designing the transformation hardware in such a way that the input stream to the transformation hardware has fewer specified bits than the output stream (i.e., the test cubes) of the transformation hardware. Since the linear decompressor is now producing the input stream for the transformation hardware instead of the test cubes, the test system reduces the number of specified bits that need to be encoded by the linear decompressor, thereby allowing greater compression.

Further, the disclosed embodiments provide numerous advantages over other methods and systems. As noted above, the Krishna approach supplies inputs to a linear decompressor that are encoded using a non-linear code. In the present invention, however, the inputs to the scan chains themselves are encoded with a non-linear code. The objective here is to reduce the number of specified bits that need to be produced by the linear decompressor. Whereas the method in Krishna is only applicable for LFSR reseeding where the seed is periodically loaded, the present invention applies to any linear decompressor including combinational and sequential continuous-flow decompressors (for which the method in Krishna cannot be used). Further, as noted above, the Sun approach uses dictionary coding and LFSR reseeding combined such that either one or the other is used to load each scan bit-slice. In the proposed method, statistical coding is combined with a linear decompressor and both are used together for all scan bit-slices enabling a continuous-flow decompression with greater efficiency.

Figure 5:
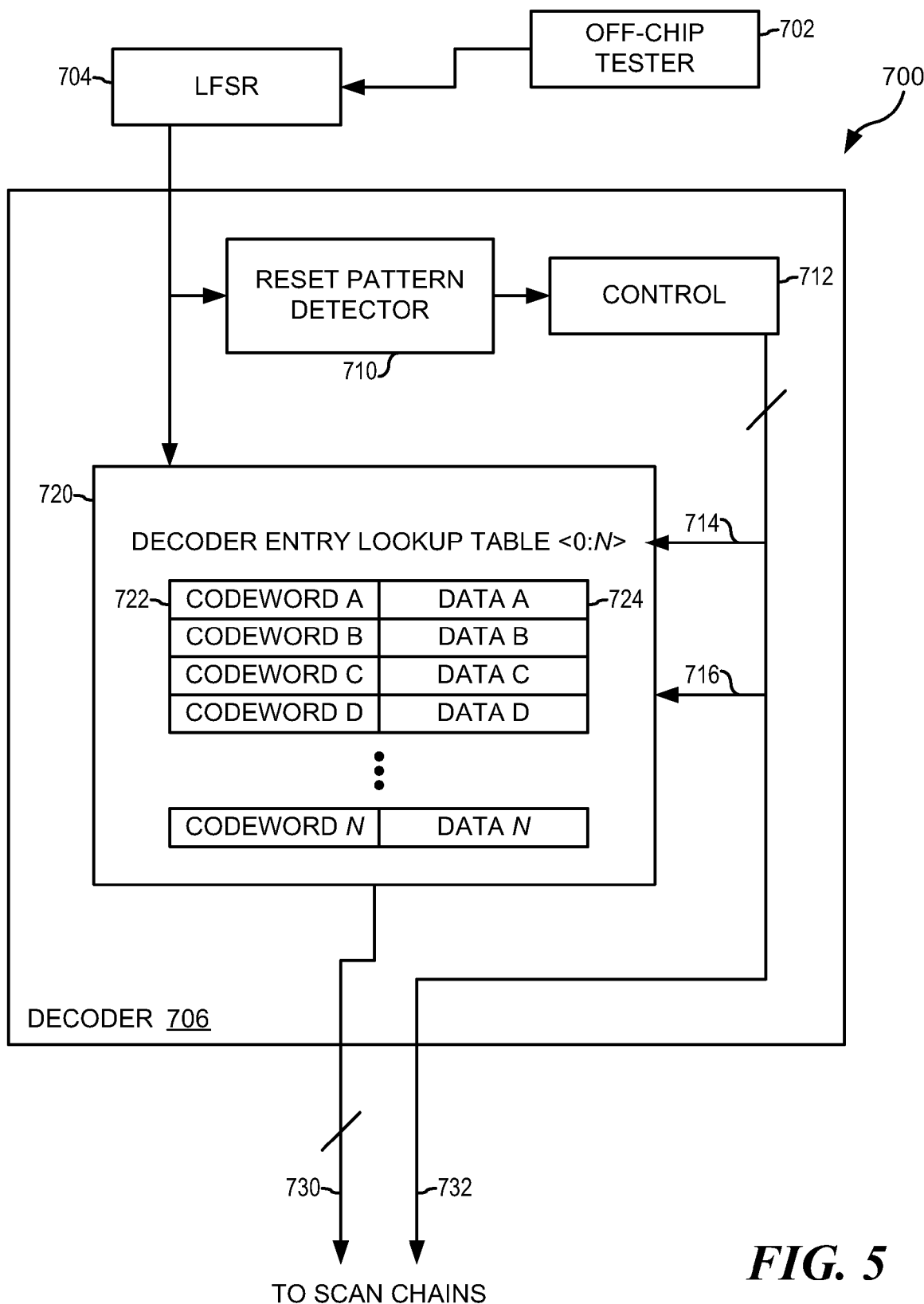
FIG. 5 illustrates a block diagram showing an exemplary test data decompression system in accordance with another preferred embodiment.

FIG. 5 shows an alternative embodiment. Specifically, FIG. 5 illustrates a block diagram showing an exemplary test data decompression system in accordance with an alternate preferred embodiment, generally indicated by reference numeral 700.

Test system 700 includes off-chip tester 702. Generally, off-chip tester 702 is an otherwise conventional test device, as one skilled in the art will understand. Off-chip tester 702 generates raw test data and transmits the generated raw test data to LFSR 704.

In one embodiment, LFSR 704 is an otherwise conventional linear feedback shift register, situated on board the tested chip or device. In an alternate embodiment, LFSR 704 is an otherwise suitable decompressor configured to receive an input vector and to generate an output vector in response to the input vector. In one embodiment, LFSR 704 receives raw test data from off-chip tester 702 as an input vector, and generates an output vector in response to the input vector. As described above, there are a variety of well-known methods to unroll an LFSR input vector into an output vector. In a preferred embodiment, the output vector is a test cube, as described above.

LFSR 704 couples to a decoder 706. In the illustrated embodiment, decoder 706 includes a reset pattern detector (RPD) 710 and a lookup table 720, both of which couple to LFSR 704, and receive the LFSR output vector. Generally reset pattern detector 710 is configured to test the LFSR output vector to identify a "reset pattern". In this instance, a "reset pattern" is a pre-determined sequence of bits that initiates a reload sequence, as described in more detail below.

In an alternate embodiment, reset pattern detector 710 is also configured to detect a "steering" bit or bits. The "steering bit(s)" functions in a similar manner as the decoder mode bit and/or the "encoded" bit, as described above. That is, in one embodiment, the steering bit determines which map of codewords/data to load into lookup table 720, as described below. In an alternate embodiment, the steering bit is a single bit, and indicates whether a received codeword is to be decoded or is to be passed to the scan chains as received.

Reset pattern detector 710 couples to a control logic 712. Control 712 is configured to receive a notification of a reset pattern and/or the steering bit, and to provide control signals to lookup table 720 and the scan chains (not shown). Generally, control 712 transmits codeword/data pairs to lookup table 720 through a communication channel 714. As described above, a codeword identifies a particular test data pattern for application in the scan chains. The previous figures above describe some of the mechanisms to generate and associate codewords and test data patterns in accordance with various embodiments.

Control 712 also transmits read/write and other control instructions to lookup table 720 through a communication channel 716. Control 712 also transmits other control instructions to the scan chains (not shown) through a communication channel 732.

Generally, decoder entry lookup table 720 is an otherwise conventional lookup table, except as modified herein. In particular, lookup table 720 contains a plurality of codeword/data pairs and is generally configured to receive a codeword from LFSR 704, and to transmit the corresponding test data block to the scan chains through a communication channel 730. In one embodiment, lookup table 720 contains a map or other suitable data structure comprising pairs of a codeword 722 associated with a test data block 724. In one embodiment, lookup table 720 is a content-addressable memory (CAM).

Generally, in operation, test system 700 operates as follows. (On-chip) LFSR 704 receives raw test data from off-chip tester 702 and transmits a corresponding output vector to decoder 706. Reset pattern detector 710 tests the output vector for a reset pattern and/or a steering bit. Reset pattern detector 710 passes the test results to control 712 for subsequent action.

Depending on the steering bit, control 712 indicates to lookup table 720 that the pending output vector is to be passed to the scan chains as received. That is, the steering bit indicates an unencoded test data block, as described above. In the event of a rest pattern, control 712 initiates a reload sequence, described in more detail in conjunction with FIG. 8, below. Generally, however, a reload sequence reloads lookup table 720 with modified or otherwise refreshed codeword/data pairs. In one embodiment, the reset pattern indicates one of a plurality of predetermined codeword/data pair sets to load. In an alternate embodiment, control 712 loads the next one of a predetermined sequence of codeword/data pair sets.

So configured, test system 700 embodies a novel method for adaptive nonlinear test vector compression. The nonlinear decoder 706 embodies the unique capability to adaptively change the decode characteristics based on the output stream received from the linear decompressor (LFSR 704). Furthermore, this novel capability does not require significant additional hardware costs.

As described above, test system 700 embodies a novel system and method to improve test data decompression. FIG. 8 illustrates one embodiment of a method to improve test data decompression. Specifically, FIG. 8 illustrates a high-level flow chart 800 that depicts logical operational steps performed by, for example, system 700 of FIG. 7, which may be implemented in accordance with a preferred embodiment.

As indicated at block 805, the process begins, wherein the LFSR, such as, for example, LFSR 704 of FIG. 7, receives test data from the off-chip tester 702. As described above, this process also includes unrolling an output vector in response to the received input vector (test data) from the off-chip tester 702.

Next, as illustrated at decisional block 810, the decoder, such as, for example, decoder 706 of FIG. 7, determines whether the received output vector matches a predetermined reset pattern. If the received output vector is not a reset pattern, the process continues along the NO branch, to decisional block 815, wherein the decoder 706 determines whether the steering bit is set. At this block, the steering bit serves as a "reload sequence in progress" bit, indicating whether test system 700 is in the middle of a reload sequence. In the illustrated embodiment, the steering bit is set if it is equal to logic 1. In normal operation, the steering bit indicates whether lookup table 720 is to pass the associated codeword directly to the test cubes as received, as described above.

If at decisional block 815 the steering bit is not set, the process continues along the NO branch to block 820, wherein the test system performs the standard decode process, described above. In one embodiment, the lookup table 720 outputs to the scan chains the data pattern corresponding to the received input codeword. If the steering bit is set, the process continues along the YES branch to block 830, described below.

If at decisional block 810 the received output vector is a reset pattern, the process continues along the YES branch to block 825. Next, as illustrated at block 825, decoder 706 sets certain tracking variables. In particular, decoder 706 sets i (the iteration)=0, N=the number of codewords in the codeword/data set, and S (the steering bit)=1.

Next, as illustrated at block 830, the LFSR advances (or is otherwise clocked) one clock cycle. One skilled in the art will understand that clocking the LFSR one cycle advances the output vector to the next codeword. In this case, as test system 700 is in a reload sequence, the output vector is the next new codeword in the reloaded codeword/data set.

Next, as illustrated at block 835, decoder 706 transfers the LFSR output to decoder 706. In particular, decoder 706 transfers the LFSR output to lookup table 720. Next, as illustrated at decisional block 840, decoder 706 determines whether the current iteration is the first iteration, or "cycle 1" of the reload sequence. In one embodiment, decoder 706 reads the iteration variable "i", wherein if i==0, the current iteration is the first iteration.

If the current iteration is the first iteration, the process continues along the YES branch to block 845 wherein decoder 706 stores the LFSR output as a codeword 722. The process returns to block 805, wherein the LFSR receives additional test data from the off-chip data tester. If the current iteration is not the first iteration, the process continues along the NO branch to block 850, wherein the decoder stores the appropriate test data pattern matching the previously stored codeword as test data 724 of lookup table 720. The process continues to decisional block 855.

Next, as illustrated at decisional block 855, decoder 706 determines whether the current iteration is the Nth iteration; that is, whether the last of the sequence of codeword/data pairs has been reloaded into lookup table 720. If the current iteration is not the Nth iteration, the process continues along the NO branch to block 860, wherein the value of i is incremented by one. The process then returns to block 805, wherein the LFSR receives additional test data from the off-chip data tester.

If the current iteration is the Nth iteration, the process continues along the YES branch to block 865, wherein decoder 706 sets S=0. The process returns to block 805, wherein the LFSR receives additional test data from the off-chip data tester.

So configured, test system 700 supports adaptable reloading of lookup table 720. That is, a predetermined output vector serves as a series of reset patterns and codeword/data pairs that load into lookup table 720. Coming out of a reload sequence, test system 700/800 operates to decode (encoded) codewords to their associated test data patterns for application in the scan chains. This approach both reduces raw test data input vector size, but also allows for test data reconfiguration during both the design, manufacturing, and operational phases of chip life.

Accordingly, the flexibility of the extended system allows for designers to modify test data on the fly during the initial testing stages of the chip or to allow the system to be configured to map to different configuration settings for the chip. For example, if the system is being shipped to a customer that has only portions of the functional units enabled, the tester can test only those components that are enabled, which significantly reduces test time for that configuration option. Additional advantages are readily apparent to those skilled in the art.

It will be appreciated that variations of the above-disclosed and other features and functions, or alternatives thereof, may be desirably combined into many other different systems or applications. Also, one skilled in the art will appreciate that various presently unforeseen or unanticipated alternatives, modifications, variations or improvements therein may be subsequently made by those skilled in the art which are also intended to be encompassed by the following claims.

What is claimed is:

1. A system, comprising:
    a decompressor configured to receive an input test vector and to generate an output vector in response to the input test vector;

a decoder coupled to the decompressor and comprising a reset pattern detector, a lookup table, and control logic;

wherein the reset pattern detector (RPD) is configured to scan the output vector to identify a predetermined reset pattern;

wherein the control logic couples to the RPD and the lookup table and is configured to direct operation of the lookup table in a first mode or a second mode based on whether the output vector comprises the predetermined reset pattern, as identified by the RPD; and wherein the lookup table is configured:
to receive the output vector;
to operate in the first mode, comprising storing one of a plurality of codeword sets, each codeword set comprising a plurality of pairs of codewords and associated data; and
to operate in the second mode, comprising generating test data blocks in response to identified codewords in the output vector.

2. The system of claim 1, wherein the decompressor comprises a linear feedback shift register (LFSR).

3. The system of claim 1, wherein the codeword set comprises a map data structure.

4. The system of claim 1, wherein the decoder couples to a plurality of scan chains.

5. The system of claim 1, wherein operating in the first mode comprises storing a codeword set based on the output vector.

6. The system of claim 1, wherein operating in the first mode comprises storing a codeword set based on a predetermined sequence of codeword sets.

7. The system of claim 1, wherein the predetermined reset pattern comprises a steering bit.

8. The system of claim 7, wherein the steering bit indicates one of a plurality of predetermined codeword sets for storage in the first mode of operation.

9. The system of claim 1, wherein one of the plurality of codeword sets comprises unencoded test data.

10. A method for adaptive test data compression, comprising:
receiving, by a processor, an input vector;
decompressing, by the processor, the input vector to generate an output vector;
determining whether the output vector comprises a reset pattern;
in the event the output vector comprises the reset pattern, loading one of a plurality of codeword sets into a lookup table, each codeword set comprising a plurality of pairs of codewords and associated data; and
in the event the output vector does not comprise the reset pattern, identifying codewords in the output vector and generating test data blocks in response to identified codewords.

11. The method of claim 10, wherein the reset pattern comprises a steering bit.

12. The method of claim 11, wherein the steering bit identifies one of the plurality of codeword sets.

13. The method of claim 10, wherein one of the plurality of codeword sets comprises unencoded data.

14. The method of claim 10, wherein the loaded one of the plurality of codeword sets is based on the output vector.

15. The method of claim 10, wherein the loaded one of the plurality of codeword sets is based on a predetermined sequence of codeword sets.

16. A processor for adaptive test data compression, the processor including a computer program product having a non-transitory computer-readable medium with a computer program embodied thereon, the computer program comprising:
computer code for receiving an input vector;
computer code for decompressing the input vector to generate an output vector;
computer code for determining whether the output vector comprises a reset pattern;
computer code for, in the event the output vector comprises a reset pattern, loading one of a plurality of codeword sets into a lookup table, each codeword set comprising a plurality of pairs of codewords and associated data; and
computer code for, in the event the output vector does not comprise a reset pattern, identifying codewords in the output vector and generating test data blocks in response to identified codewords.

17. The processor of claim 16, wherein the reset pattern comprises a steering bit that identifies one of the plurality of codeword sets.

18. The processor of claim 16, wherein one of the plurality of codeword sets comprises unencoded data.

19. The processor of claim 16, wherein the loaded one of the plurality of codeword sets is based on the output vector.

20. The processor of claim 16, wherein the loaded one of the plurality of codeword sets is based on a predetermined sequence of codeword sets.

* * * * *